US008084896B2

(12) United States Patent
Frankel

(10) Patent No.: US 8,084,896 B2
(45) Date of Patent: Dec. 27, 2011

(54) MONOLITHIC STAGE POSITIONING SYSTEM AND METHOD

(75) Inventor: Joseph G. Frankel, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 107 days.

(21) Appl. No.: 12/347,551

(22) Filed: Dec. 31, 2008

(65) Prior Publication Data

US 2010/0164305 A1 Jul. 1, 2010

(51) Int. Cl.
*H02K 41/00* (2006.01)
(52) U.S. Cl. .................................... 310/12.04
(58) Field of Classification Search ..... 310/12.04–12.06
See application file for complete search history.

(56) References Cited

U.S. PATENT DOCUMENTS

| | | | | | |
|---|---|---|---|---|---|
| 4,857,781 | A | * | 8/1989 | Shih | 310/12.08 |
| 5,196,745 | A | * | 3/1993 | Trumper | 310/12.06 |
| 5,763,965 | A | * | 6/1998 | Bader | 310/12.06 |
| 5,886,432 | A |   | 3/1999 | Markle | |
| 6,144,118 | A |   | 11/2000 | Cahill et al. | |
| 6,184,596 | B1 |   | 2/2001 | Ohzeki | |
| 6,252,314 | B1 | * | 6/2001 | Ebinuma | 310/12.06 |
| 2007/0041024 | A1 |   | 2/2007 | Gao et al. | |
| 2008/0246348 | A1 |   | 10/2008 | Angelis et al. | |
| 2008/0285004 | A1 |   | 11/2008 | Binnard et al. | |

FOREIGN PATENT DOCUMENTS

| | | |
|---|---|---|
| JP | 05057550 | 9/1993 |
| JP | 09239628 | 9/1997 |
| WO | WO 00/10242 | 2/2000 |

OTHER PUBLICATIONS

Philips Applied Technologies, Magnetic Levitation Planar Technology Backgrounder, http://www.apptech.philips.com/press_center_archive/planar_magley_backgrounder.html, Oct. 16, 2006, Dec. 11, 2008.
Philips Applied Technologies, Philips Nforcer Techonology Achieves Breaktrough in Precision Linear Motor Performance, http://www.apptech.philips.com/press_center/philips_nforcer_technology.html, Oct. 12, 2007, Dec. 3, 2008.
Notification of Transmittal of the International Search Report and the Written Opinion of the International Searching Authority, or the Declaration dated Aug. 9, 2010, for PCT/US2009/069033, filed Dec. 21, 2009.

* cited by examiner

*Primary Examiner* — Dang D Le
(74) *Attorney, Agent, or Firm* — Stoel Rives LLP

(57) ABSTRACT

A magnetically levitated monolithic stage positioning system includes linear three phase motors and coil windings connected to the monolithic stage that interact with a ferromagnetic base. The linear three phase motors may be excited to provide motion in an X-axis direction, motion in a Y-axis direction, and rotation about a Z-axis. The monolithic stage is levitated on an air bearing. The plurality of coil windings connected to the monolithic stage may serve to magnetically preload the air bearing. The plurality of coil windings may be excited to provide motion in a Z-axis direction and rotation of the monolithic stage about the X-axis and about the Y-axis.

20 Claims, 6 Drawing Sheets

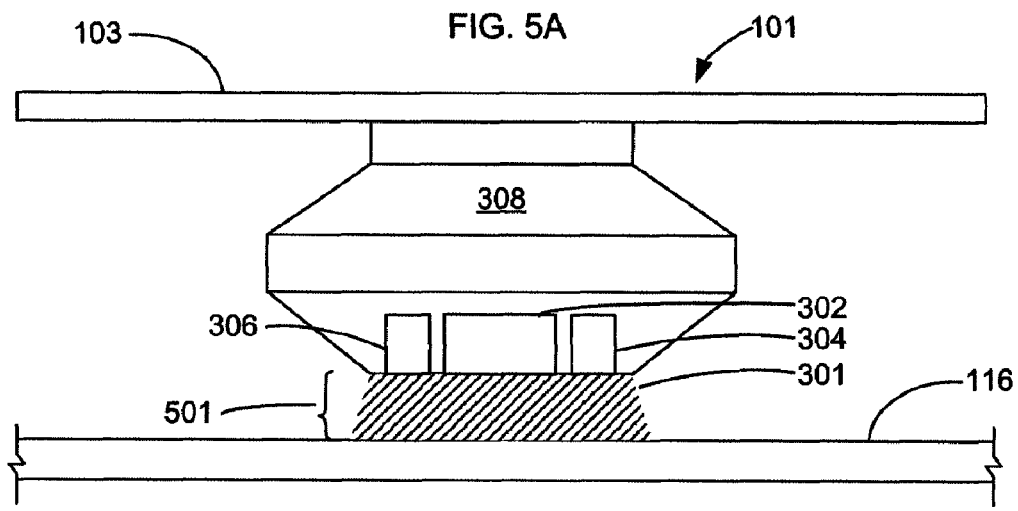
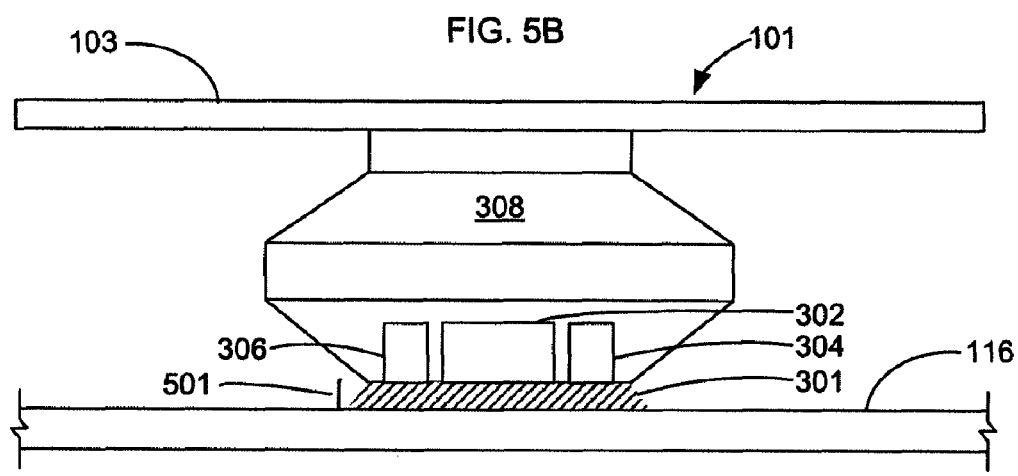
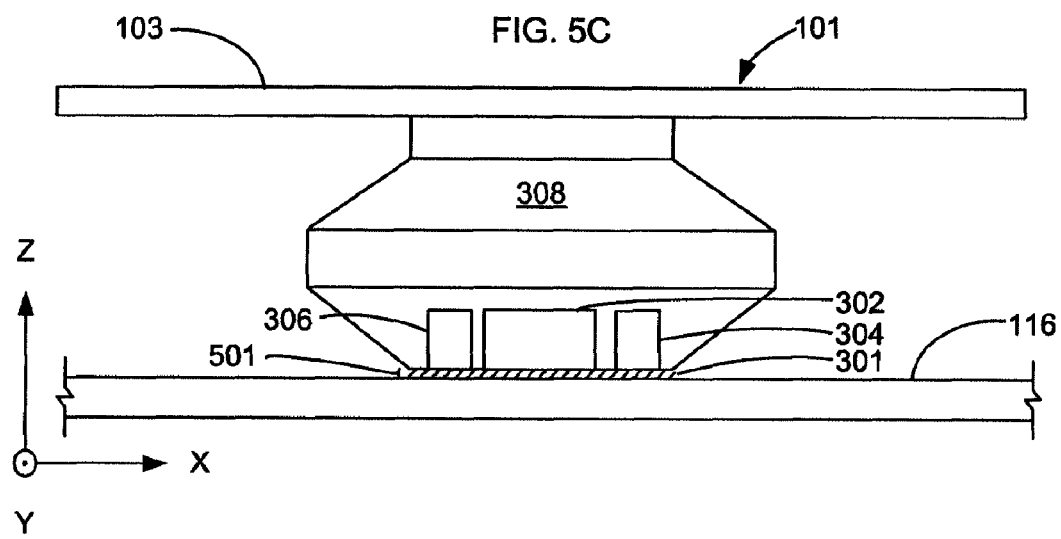

US 8,084,896 B2

MONOLITHIC STAGE POSITIONING SYSTEM AND METHOD

TECHNICAL FIELD

This disclosure relates to positioning systems and methods utilizing a monolithic stage.

BACKGROUND INFORMATION

Positioning systems may be used in a variety of contexts for positioning a workpiece with respect to a tool. For example, in laser processing systems, a workpiece is typically carried on a table and positioned, before a laser beam is brought to bear on the workpiece. Traditional positioning systems utilize X-Y translation tables, which may include stacked and split designs.

In a stacked stage positioning system, the lower stage supports the inertial mass of the upper stage, which supports a workpiece. Such systems typically move the workpiece relative to a laser beam. The upper stage and lower stage may provide motion control in orthogonal dimensions. In one implementation of a stacked stage design, the X-axis motion stage carries the Y-axis motion stage. In such a configuration, the X-axis motion stage typically has less acceleration and bandwidth because it carries the mass of the Y-axis motion stage. The Y-axis motion stage is typically lighter, and is able to deliver greater acceleration and bandwidth. Stacked stage positioning systems typically account for motion dynamics caused by the relative motion of one portion of the stage to the other. These motion dynamics may result in non-linear effects arising from the moving center of gravity of the X stage as the Y stage moves relative to the X stage.

In split axis positioning systems, the upper stage is not supported by, and moves independently from, the lower stage. The workpiece is typically carried on the lower stage while a tool, such as a fixed reflecting mirror and focusing lens, is carried on the upper stage. A split axis design decouples driven stage motion along two perpendicular axes lying in separate, parallel planes. A split stage design has a benefit of a kinematic loop between the two axes passing through the force frame, which is typically a heavy granite block; however, split stages may exhibit problems of repeatability between the upper stage and the lower stage. Both stacked or split stage designs exhibit bearing tolerance stack-up (i.e., each bearing contributes some uncertainty to a process), which limits the precision of the positioning system.

SUMMARY OF THE DISCLOSURE

A system for positioning a workpiece according to one embodiment utilizes a monolithic stage configured to support the workpiece. The monolithic stage includes a plurality of linear forcers. A ferromagnetic base is positioned below the monolithic stage. An air bearing is created between the stage and the ferromagnetic base. The air bearing provides a levitating force to the monolithic stage. A magnetic track is connected to the base plate, and creates a magnetic field. The linear forcers are each operable to carry a current through the magnetic field created by the magnetic track. The currents generate forces to provide planar motion to the monolithic stage in three degrees of freedom. A coil winding is attached to the monolithic stage, and provides motion in at least one other degree of freedom using magnetic attraction with the ferromagnetic base plate.

A method for positioning a workpiece according to another embodiment utilizes a monolithic stage that carries a workpiece. The method includes generating an air bearing between a ferromagnetic base and the monolithic stage by forcing pressurized air out of an orifice in the monolithic stage. The air bearing provides a levitating force to the monolithic stage. The method also includes generating a magnetic field using a magnetic track. Currents are selectively driven through a plurality of linear forcers attached to the monolithic stage in the presence of the magnetic field, such that the current selectively generates forces to provide planar motion to the driven linear forcers. Currents are also selectively driven through at least one coil winding attached to the monolithic stage to provide motion in at least one other degree of freedom using magnetic attraction with the ferromagnetic base.

Additional aspects and advantages will be apparent from the following detailed description of preferred embodiments, which proceeds with reference to the accompanying drawings.

BRIEF DESCRIPTION OF THE DRAWINGS

FIG. 5A is a side view of a monolithic stage at a maximum flying height according to one embodiment.

FIG. 5B is a side view of a monolithic stage at an intermediate flying height according to one embodiment.

FIG. 5C is a side view of a monolithic stage at a minimum height according to one embodiment.

DETAILED DESCRIPTION OF PREFERRED EMBODIMENTS

Figure 1:
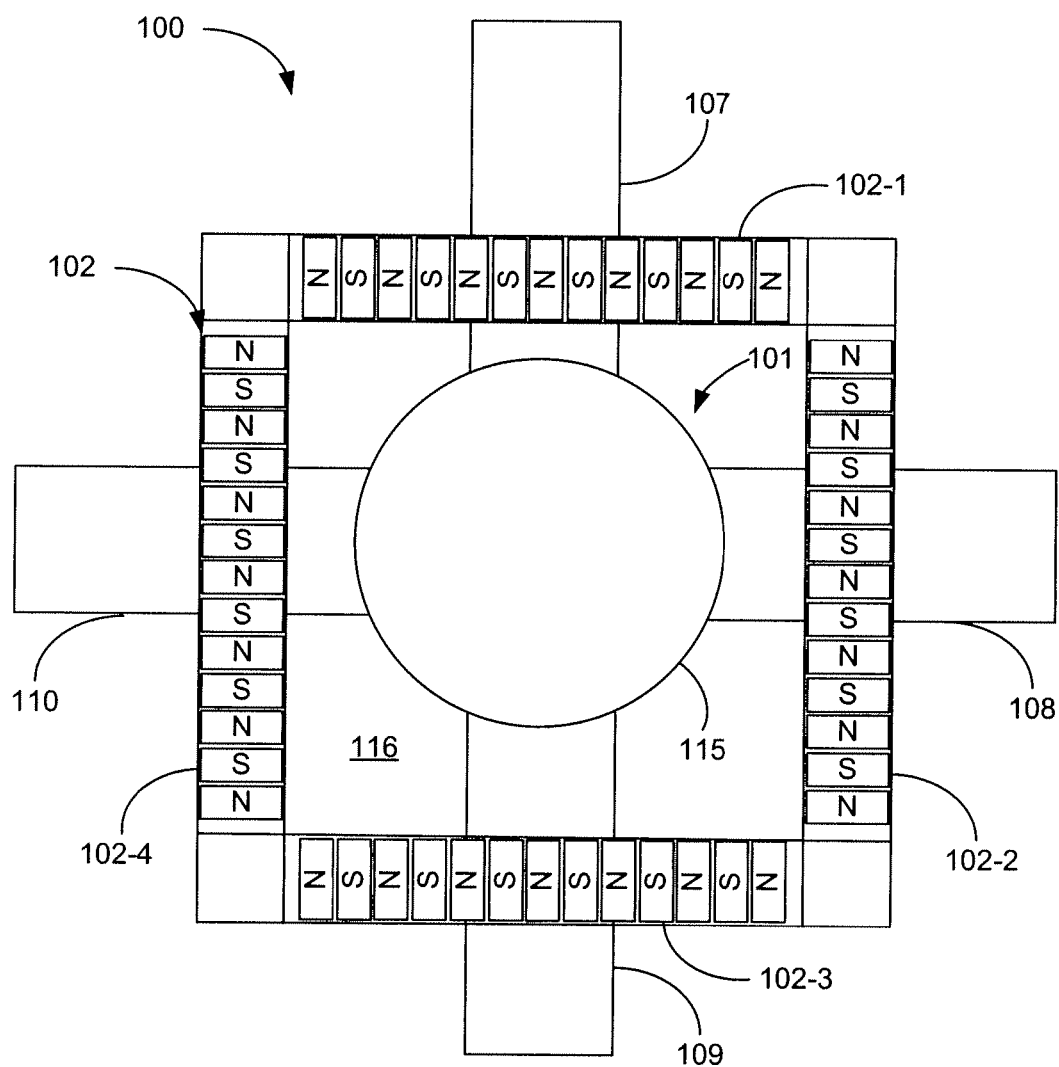
FIG. 1 is a top view of a monolithic positioning system according to one embodiment.

In the following description, numerous specific details are provided for a thorough understanding of the embodiments disclosed herein. However, those skilled in the art will recognize that the embodiments can be practiced without one or more of the specific details, or with other methods, components, or materials. Further, in some cases, well-known structures, materials, or operations are not shown or described in detail in order to avoid obscuring aspects of the embodiments. Furthermore, the described features, structures, or characteristics may be combined in any suitable manner in one or more embodiments.

Disclosed herein are embodiments of a monolithic stage positioning system including linear motors for motion in the X-axis and Y-axis directions, and magnetically levitated air bearings having multiple coil windings connected to the monolithic stage that interact with a ferromagnetic base. A monolithic stage positioning system as disclosed herein has an advantage over stacked stage positioning systems due to a lack of mechanical compliance between the coupled axes, and over split stage positioning systems due to eliminating the adverse effects of cross-axis bearing dynamics. A monolithic stage positioning system as disclosed herein may further reduce the complexity and associated cost of coordinated motion control of multiple moving masses. A monolithic stage as disclosed herein may allow for driving forces to be symmetric about the center of mass of the monolithic stage. Accordingly, undesired angular motion may be reduced or eliminated.

A monolithic stage positioning system is applicable to many uses in semiconductor processing including dicing, component trim, fuse processing, scribing, memory repair, singulation, inking, printed wire board (PWB) via drilling, routing, inspection, and metrology. The advantages afforded by such a design are also of benefit to a whole class of mechanical machining tools.

The monolithic stage is levitated with one or more air bearings, and may translate in the X-axis and the Y-axis directions by coordinating the efforts of a plurality of linear motors. In one embodiment, two opposing linear motors provide motive force in the X-axis direction, and two opposing linear motors provide motive force in the Y-axis direction. Each linear motor includes a linear forcer and a magnetic track. Current passes through the linear forcer and interacts with the magnetic field created by the magnetic track to generate linear motive force. Opposing pairs of linear motors may be driven in different directions to generate rotation about the Z-axis. Accordingly, the plurality of linear motors may allow the monolithic stage to move with three degrees of freedom.

One or more coil windings may be attached to the monolithic stage and may be selectively excited to generate an attractive force with respect to the ferromagnetic base. The plurality of coil windings may serve to magnetically preload the air bearing. The plurality of coil windings may be excited by a common mode current to translate the monolithic stage in the Z-axis direction. Differential control over the plurality of coil windings may allow rotation of the monolithic stage about the X-axis and about the Y-axis. Accordingly, the plurality of coil windings attached to the monolithic stage may allow the monolithic stage to move with an additional three degrees of freedom.

Utilizing the plurality of linear motors in concert with the plurality of coil windings attached to the monolithic stage may allow the motion of the monolithic stage to be controlled with six degrees of freedom without mechanical contact with a supporting force frame. The monolithic stage is primarily moveable in the X-axis direction and the Y-axis direction. The range of motion in the remaining four degrees of freedom (i.e. Z-axis translation, and rotation about each of the X-axis, Y-axis, and Z-axis) is small relative to the range of motion in the X-axis and the Y-axis directions. A monolithic stage with six degrees of freedom may eliminate the need for a secondary (fine) positioning system.

FIG. 1 illustrates one embodiment of a positioning system 100 comprising a monolithic stage 101 and a magnetic track 102. A chuck 115 is attached to the monolithic stage 101 and may support a workpiece (not shown). A carriage (shown as reference number 308 in FIG. 3) may be located below the chuck 115. The carriage 308 connects the chuck 115, structures (not shown) for generating an air bearing (shown as reference number 301 in FIG. 3), a plurality of coil windings (reference numbers 303, 304, 305, 306 in FIG. 4), and a plurality of linear forcers 107,108,109, 110. The monolithic stage 101 includes the carriage 308 (shown in FIG. 3), the chuck 115, the plurality of coil windings 303, 304, 305, 306 (shown in FIG. 4), and the linear forcers 107, 108, 109, 110. The magnetic track 102 defines a working area within which the chuck 115 may be positioned.

The illustrated embodiment of the positioning system 100 comprises four linear motors. Each linear motor includes a linear forcer and a section of magnetic track. A first linear motor includes the linear forcer 107 and a section 102-1 of the magnetic track 102. A second linear motor includes the linear forcer 108 and a section 102-2 of the magnetic track 102. A third linear motor includes the linear forcer 109 and a section 102-3 of the magnetic track 102. A fourth linear motor includes the linear forcer 110 and a section 102-4 of the magnetic track 102. A ferromagnetic base plate 116 is positioned under the monolithic stage 101. The ferromagnetic base may include any material that may be attracted by a magnet, including iron, nickel, cobalt, and other known magnetic materials. As described below, the ferromagnetic base plate 116, together with the plurality of coil windings 303, 304, 305, 306 (shown in FIG. 4) attached to the monolithic stage 101 allow for control of Z-axis translation, as well as rotation about the X-axis and the Y-axis.

Figure 2:
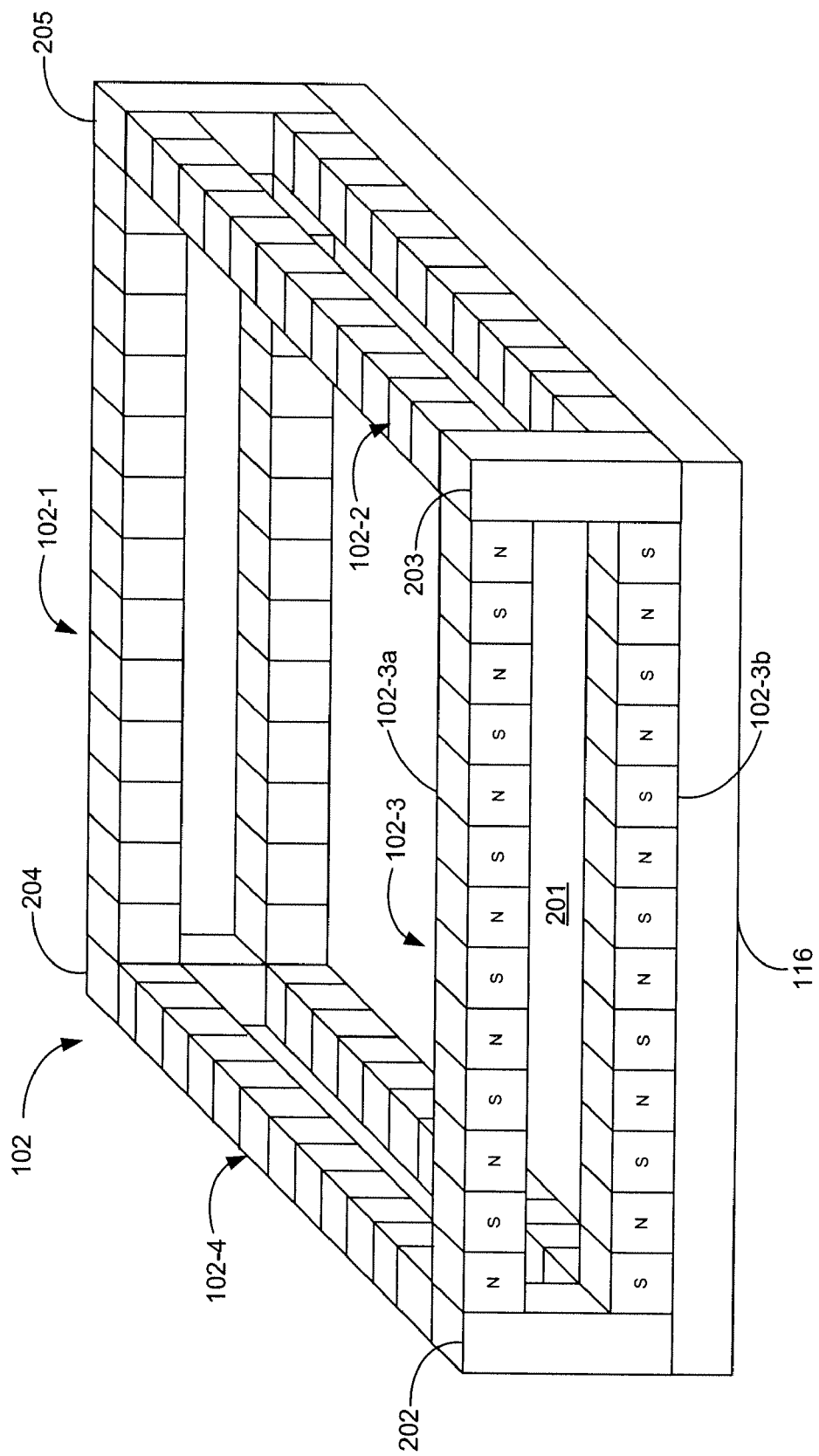
FIG. 2 is a perspective view of a magnetic track according to one embodiment.

FIG. 2 is a perspective view of the magnetic track 102. Each section of the magnetic track 102-1, 102-2, 102-3, 102-4 includes an upper and lower section. Using section 102-3 of the magnetic track 102 as an example, an upper section 102-3$a$ includes a linear array of multiple magnets arranged along its length. Similarly the lower section 102-3$b$ includes a linear array of multiple magnets arranged along its length. As illustrated, the polarity of the magnets arranged along the length of the track may alternate. A gap 201 exists between the upper section 102-3$a$ and the lower section 102-3$b$. A linear forcer (not shown) may extend through the gap 201. The ferromagnetic base 116 is positioned below the magnetic track 102. A plurality of support members 202, 203, 204, 205 provide support for the various sections of the magnetic track 102-1, 102-2, 102-3, 102-4. A substantially square magnetic track 102 is shown in FIG. 2; however, in alternative embodiments other geometries may also be used.

Returning to FIG. 1, currents flowing through the linear forcers 107, 108, 109, 110 interact with the magnetic field of the respective portion of the magnetic track 102 to provide motive force for positioning the monolithic stage 101 at a desired location. Linear forcers 107 and 109 provide motive force in the X-axis direction, while linear forcers 108 and 110 provide motive force in the Y-axis direction. As illustrated in FIG. 1, the linear forcers 107, 108, 109, 110 may extend beyond the magnetic track 102 through a gap between an upper section and a lower section. As such, the chuck 115 is moveable within a work area defined by the magnetic track 102.

The linear forcers 107, 108, 109, 110 may include three-phase coil windings. Three phase linear motors have constant acceleration as a function of position because the force vectors that contribute from each phase combine to give smooth forces and efficient motion. Three-phase coil windings may be desirable to reduce or eliminate cogging or force ripple, which may degrade the performance of the positioning system.

Translation in the X-axis direction and the Y-axis direction may be achieved with common mode current through symmetric opposing linear forcers. For example, common mode current through linear forcers 107 and 109 results in motion in the X-axis direction. Common mode current through linear forcers 108 and 110 results in motion in the Y-axis direction.

The linear motors may also allow for small angle rotation about the Z-axis (yaw). In one embodiment, rotation about the Z-axis may be less than approximately five degrees. The range of rotation may be limited because the efficiency of the linear motors decreases as a function of the cosine of the angle of rotation. Rotation about the Z-axis may be controlled with differential currents through symmetric opposing linear forcers. For example, differential currents through linear forcers 107 and 109 results in either a clockwise or counterclockwise rotation of the monolithic stage 101 with respect to the Z-axis.

The direction of the rotation may be reversed by switching the polarity of the current flowing through linear forcers 107 and 109. Similarly, rotation about the Z-axis may also be generated using linear forcers 108 and 110.

As illustrated in FIG. 1, linear forcers 107, 108, 109, 110 are symmetrically positioned about the monolithic stage 101. The symmetrical design allows for the monolithic stage 101 to be driven by forces that are symmetric about the center of mass. Symmetric forces driving the monolithic stage 101 are advantageous because undesired angular motion of the monolithic stage 101 may be reduced or eliminated.

In certain embodiments, control logic (not shown) for exciting coil windings in each linear forcer 107, 108, 109, 110 includes an encoder or interferometer in each dimension. Three encoders, three interferometers, or some combination thereof, may determine the position of the monolithic stage 101 along the X-axis, the Y-axis, and the rotation about the Z-axis. Position information from the three interferometers and/or encoders may be used in a closed-loop control system to control X-axis and Y-axis translation, and rotation about the Z-axis. Three capacitive sensors may be employed to measure the distance between the bottom of the carriage and the ferromagnetic plate 116. Information from the capacitive sensors may be used in a closed-loop control system to control translation of the monolithic stage 101 in the Z-axis direction and the rotation of the monolithic stage 101 about the X-axis and the Y-axis. It is contemplated that reaction motors and masses may be incorporated into the system. The reaction motors and masses may apply forces to a stationary portion of the positioning system 100, which are directed opposite to the forces generated by the motion of the monolithic stage 101, such that no net motion is created by the motion of the monolithic stage 101.

Windings in each of the linear forcers 107, 108, 109, 110 are wound with appropriate consideration of the relationship of the windings and the magnetic field created by the magnetic track 102, so as to efficiently commutate in the direction of motion while allowing for motion in the lateral direction. As illustrated, only a portion of the linear forcers 107, 108, 109, 110 is within the magnetic field generated by the magnetic track at a given time. Accordingly, current may flow through portions of windings in the linear forcers 107, 108, 109, 110 that may not generate motive force. The increased length of windings required in the system may result in increased electrical resistance; however, the monolithic stage 101 may have a large range of motion in both the X-axis and the Y-axis directions.

Figure 3:
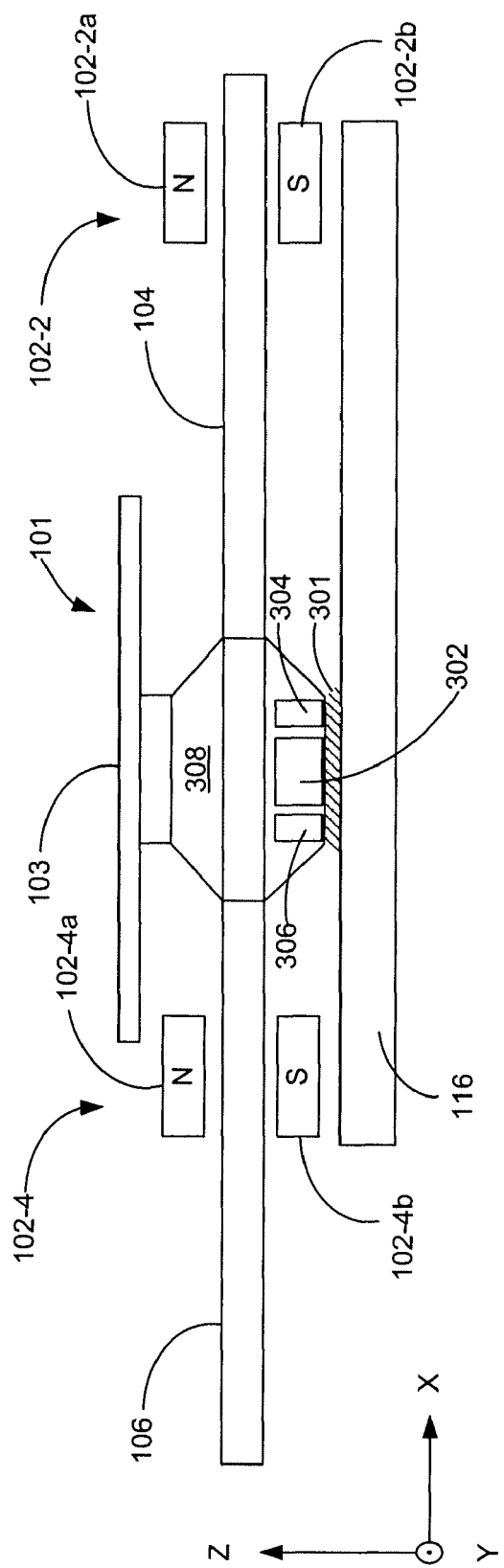
FIG. 3 is a side view of a monolithic stage according to one embodiment.

FIG. 3 is a side view of the monolithic stage 101. As illustrated in FIGS. 1 and 3, the configuration of the monolithic stage 101 is such that the linear forcers 107, 108, 109, 110 remain within their respective segments of the magnetic track 102 at any position within the work area defined by the magnetic track 102. The chuck 115 sits atop the carriage 308 and may carry a workpiece (not shown). The linear forcer 106 is connected to the carriage 308 and is disposed between an upper section 102-4a and a lower section 102-4b of magnetic track section 102-4. Similarly, the linear forcer 106 is connected to the opposite side of the carriage 308, and is disposed between an upper section 102-2a and a lower section 102-2b of magnetic track section 102-2. In operation, an air bearing 301 is disposed between the monolithic stage 101 and the ferromagnetic base 116. The air bearing 301 is generated by pressurized air forced out of an orifice 302 on the bottom side of the carriage 308. The orifice 302 may be a porous face or other suitable structure. The escaping pressurized air exerts upward force on the monolithic stage 101, causing the monolithic stage 101 to levitate. Coil windings 304 and 306 (together with coil windings 303 and 305, shown in FIG. 4) are attached to the carriage 308, and may be selectively excited to exert attractive electromagnetic force with respect to the ferromagnetic base 116. The coil windings 303, 304, 305, 306 magnetically pre-load the air bearing 301 in order to increase the stiffness of the air bearing 301, and to control z-axis translation together with rotation about the X-axis and the Y-axis.

Figure 4:
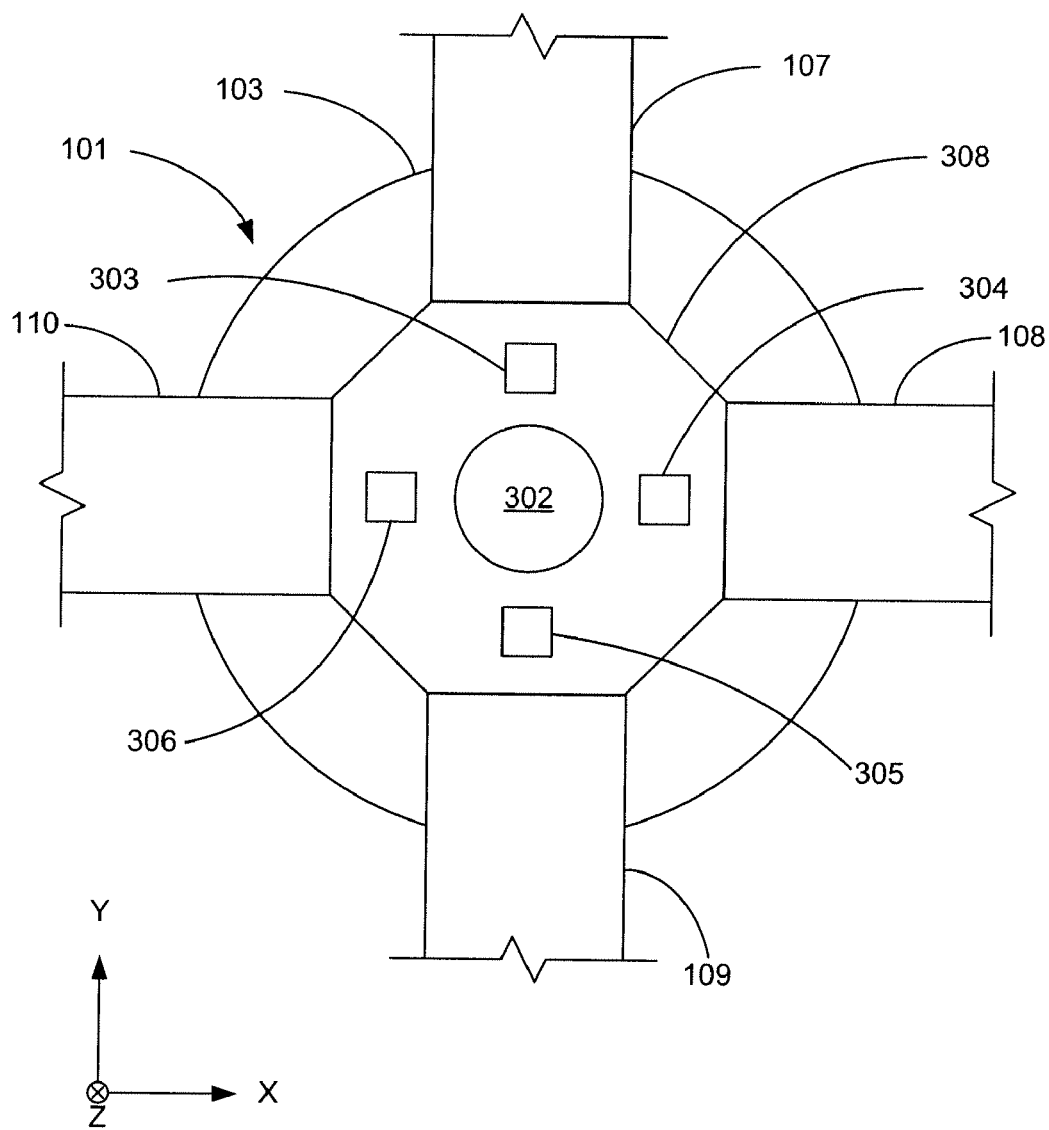
FIG. 4 is an elevation view from the bottom of the monolithic stage according to one embodiment.

FIG. 4 shows an elevation view from the bottom of the monolithic stage 101. The coil windings 303, 304, 305, 306 are connected to the carriage 308 and allow for translation of the monolithic stage 101 in the Z-axis direction, as well as for rotation of the monolithic stage 101 about the X-axis (roll) and about the Y-axis (pitch). Accordingly, utilizing the linear motors and the coil windings 303, 304, 305, 306 of the monolithic stage 101, the monolithic stage 101 may be controlled in all three translations and all three rotations through proper electrical actuation of the linear motors and coil windings 303, 304, 305, 306. More or fewer coil windings than the number of windings shown in FIG. 4 may be attached to the carriage 308. If, for example, a single coil winding is attached to the monolithic stage, the single coil winding may provide motion in at least one other degree of freedom. In alternative embodiments, the coil windings 303, 304, 305, 306 may be connected to the monolithic stage 101 in other locations than those locations illustrated in FIG. 4. For example, in one embodiment, a coil winding may be attached to the monolithic stage 101 at the outer edge of each linear forcer 107, 108, 109, 110.

FIGS. 5A, 5B, 5C, 5D, and 5E illustrate the dynamics of motion that may be controlled using the coil windings 304, 306. Air bearings that are not magnetically preloaded are typically designed for a particular flying height and corresponding pressure. Altering the pressure of the air bearing 301 may provide some control over Z-axis translation; however, the range of motion that may be achieved by altering the pressure of the air bearing is limited, and may introduce non-linearity into the system. Further, increasing the pressure of the air bearing increases the stiffness of the air bearing. Magnetically preloaded air bearings allow greater control over flying height while alleviating these problems.

Translation in the Z-axis direction may be controlled by common current through the coil windings 304, 306. FIG. 5A shows a situation in which the coil windings 304, 306 are not excited, and thus are not magnetically attracted to the ferromagnetic base 116. The upward force of the pressurized air escaping from the orifice 302 and the weight of the monolithic stage 101 are at an equilibrium position. The flying height 501 of the monolithic stage 101 is at its maximum when no attractive force is exerted by the coil windings 304, 306. The magnetic coupling of the coil windings 304, 306 may alter the equilibrium position by exerting attractive magnetic forces with respect to the ferromagnetic base 116.

FIG. 5B illustrates a situation in which the coil windings 304, 306 are excited with a common current, which is less than a maximum current. Magnetic attraction between the coil windings 304, 306 and the ferromagnetic base 116 reduces the flying height 501 in comparison to the flying height 501 in FIG. 5A. FIG. 5C illustrates that the coil windings are excited with the maximum amount of current, and accordingly the flying height 501 is at a minimum. A suitable range of adjustment of the flying height 501 using commercially available air bearings may be between a few microns and a few tens of microns. In one embodiment, the height may be adjusted by approximately 40 microns. FIGS. 5A, 5B, and 5C are not drawn to scale and the variation in flying height 501 is exaggerated for purposes of illustration.

Figure 5D:
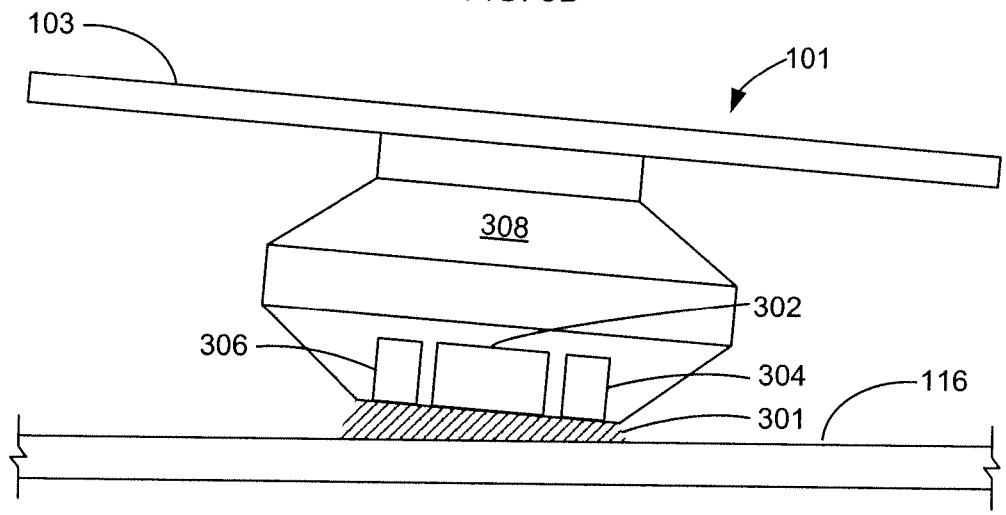
FIG. 5D is a side view of a monolithic stage rotated clockwise about the Y-axis according to one embodiment.
Figure 5E:
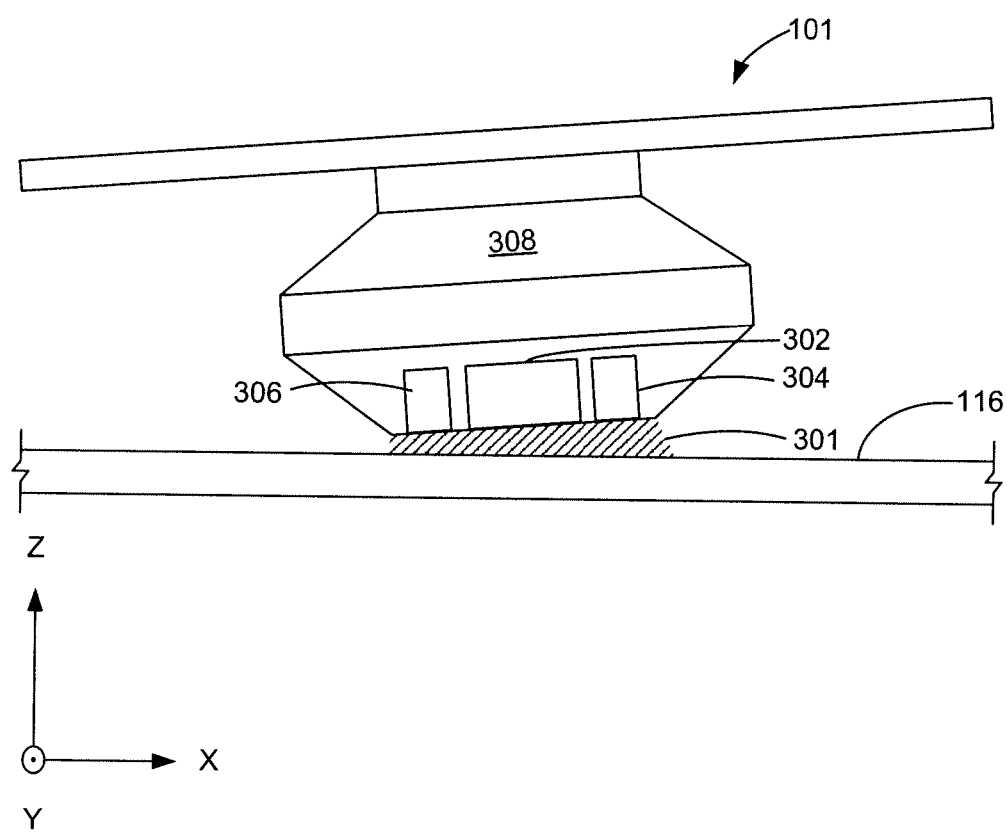
FIG. 5E is a side view of a monolithic stage rotated counterclockwise about the Y-axis according to one embodiment.

FIGS. 5D and 5E illustrate that rotation about the X-axis and the Y-axis may be controlled by differential currents in the coil windings 304, 306. In FIG. 5D, the monolithic stage 101 is rotated clockwise about the Y-axis. The clockwise rotation may be achieved by causing a larger current to flow through the coil winding 304 than the current that flows through the coil winding 306. Accordingly, the coil winding 304 exerts a stronger attractive force than the attractive force exerted by the coil winding 306. In FIG. 5E, the monolithic stage 101 is rotated counterclockwise about the Y-axis. The counterclockwise rotation may be achieved by causing a larger current to flow through the coil winding 306 than the current that flows through the coil winding 304. Although not illustrated, one of skill in the art will recognize that rotation about the X-axis may be achieved by similarly driving differential currents through the coil windings 303 and 305 (as shown in FIG. 4). FIGS. 5D and 5E are not drawn to scale and the rotation is exaggerated for purposes of illustration. It may also be noted that the linear motors have been omitted in FIGS. 5A, 5B, 5C, 5D, and 5E for purposes of more clearly illustrating the dynamics of motion that may be controlled using the coil windings 304, 306.

It will be understood by those having skill in the art that many changes may be made to the details of the above-described embodiments without departing from the underlying principles of the invention. The scope of the present invention should, therefore, be determined only by the following claims.

The invention claimed is:

1. A system for positioning a workpiece, the system comprising:
a monolithic stage configured to support the workpiece, the monolithic stage comprising a plurality of linear forcers;
a ferromagnetic base plate positioned below the monolithic stage;
an air bearing between the monolithic stage and the ferromagnetic base plate, the air bearing to provide a levitating force to the monolithic stage;
a magnetic track coupled directly to the ferromagnetic base plate, the magnetic track creating a magnetic field, the linear forcers each operable to carry a current through the magnetic field created by the magnetic track, the currents generating forces to provide planar motion to the monolithic stage in three degrees of freedom; and
at least one coil winding attached to the monolithic stage, the at least one coil winding to provide motion in at least a fourth degree of freedom using magnetic attraction with the ferromagnetic base plate.

2. The system of claim 1, wherein at least one of the linear forcers extends beyond the magnetic track, and wherein the monolithic stage is configured to move the workpiece within a work area defined by the magnetic track.

3. The system of claim 1, wherein the linear forcers provide motion in an X-axis direction, motion in a Y-axis direction, and rotation about a Z-axis.

4. The system of claim 1, wherein the magnetic track comprises a plurality of individual magnets, and wherein the plurality of magnets is arranged such that the polarity of adjacent magnets alternates.

5. The system of claim 1, wherein the linear forcers are arranged symmetrically about the monolithic stage.

6. The system of claim 1, wherein the at least one coil winding comprises four coil windings, the four coil windings operable to provide translation in a Z-axis direction, rotation about an X-axis, and rotation about a Y-axis using magnetic attraction with the ferromagnetic base plate.

7. The system of claim 6, wherein the four coil windings are arranged symmetrically about the monolithic stage.

8. The system of claim 7, wherein the plurality of linear forcers and the four coil windings allow for the monolithic stage to be positioned with six degrees of freedom.

9. A method for positioning a workpiece, the method comprising:
providing a monolithic stage to carry a workpiece;
generating an air bearing between a ferromagnetic base plate and the monolithic stage by forcing pressurized air out of an orifice in the monolithic stage, the air bearing providing a levitating force to the monolithic stage;
generating a magnetic field using a magnetic track, which is coupled directly to the ferromagnetic base plate;
selectively driving a current through a plurality of linear forcers attached to the monolithic stage in the presence of the magnetic field, such that the current selectively generates forces to provide planar motion to the monolithic stage in three degrees of freedom; and
selectively driving a current through at least one coil winding attached to the monolithic stage to provide motion in at least a fourth degree of freedom using magnetic attraction with the ferromagnetic base plate.

10. The method of claim 9, wherein at least one of the linear forcers extends beyond the magnetic track, and wherein the monolithic stage is configured to move the workpiece within a work area defined by the magnetic track.

11. The method of claim 9, wherein selectively driving a current through a plurality of linear forcers generates motion in an X-axis direction, motion in a Y-axis direction, and rotation about a Z-axis.

12. The method of claim 9, wherein the linear forcers are arranged symmetrically about the monolithic stage.

13. The method of claim 12, wherein the four coil windings are arranged symmetrically about the monolithic stage.

14. The system of claim 12, wherein the plurality of linear forcers and the four coil windings provide motion in six degrees of freedom.

15. The method of claim 9, wherein the at least one coil winding comprises four coil windings, and wherein the method further comprises:
selectively driving a current through the four coil windings generates translation in a Z-axis direction, rotation about an X-axis, and rotation about a Y-axis using magnetic attraction with the ferromagnetic base plate.

16. A system for positioning a workpiece, the system comprising:
means for carrying a workpiece on a monolithic stage;
means for generating an air bearing between a ferromagnetic base plate and the monolithic stage by forcing pressurized air out of an orifice in the monolithic stage, the air bearing providing a levitating force to the monolithic stage;
means for generating a magnetic field using a magnetic track, which is coupled directly to the ferromagnetic base plate;
means for selectively driving a current through a plurality of linear forcers attached to the monolithic stage in the presence of the magnetic field, such that the current selectively generates forces to provide planar motion to the monolithic stage in three degrees of freedom; and
means for selectively driving a current through at least one coil winding attached to the monolithic stage to provide motion in at least a fourth degree of freedom using magnetic attraction with the ferromagnetic base plate.

17. The system of claim 16, wherein at least one of the linear forcers extends beyond the magnetic track, and wherein the monolithic stage is moveable within a work area defined by the magnetic track.

18. The system of claim 16, wherein the linear forcers are arranged symmetrically about the monolithic stage.

19. The system of claim 18, wherein the at least one coil winding comprises four coil windings, and wherein the method further comprises:

selectively driving a current through the four coil windings generates translation in a Z-axis direction, rotation about an X-axis, and rotation about a Y-axis using magnetic attraction with the ferromagnetic base plate.

20. The system of claim 19, wherein the four coil windings are arranged symmetrically about the monolithic stage.

* * * * *